(12) United States Patent
Nakamura et al.

(10) Patent No.: US 9,054,081 B2
(45) Date of Patent: Jun. 9, 2015

(54) SEMICONDUCTOR DEVICE HAVING THROUGH-SUBSTRATE VIA WITH INSULATING PORTION

(75) Inventors: Nobuyuki Nakamura, Tokyo (JP); Takuyuki Muramoto, Tokyo (JP); Takeo Tsukamoto, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 203 days.

(21) Appl. No.: 13/560,085

(22) Filed: Jul. 27, 2012

(65) Prior Publication Data
US 2013/0026599 A1    Jan. 31, 2013

(30) Foreign Application Priority Data
Jul. 27, 2011 (JP) ................... 2011-164045

(51) Int. Cl.
 H01L 29/00 (2006.01)
 H01L 23/48 (2006.01)
 H01L 23/00 (2006.01)
 H01L 21/768 (2006.01)
 H01L 25/065 (2006.01)

(52) U.S. Cl.
 CPC ..... *H01L 23/481* (2013.01); *H01L 2224/16145* (2013.01); *H01L 24/13* (2013.01); *H01L 24/14* (2013.01); *H01L 2224/13021* (2013.01); *H01L 2224/1412* (2013.01); *H01L 2224/14181* (2013.01); *H01L 2224/32145* (2013.01); *H01L 2224/32225* (2013.01); *H01L 2224/73204* (2013.01); *H01L 2924/15311* (2013.01); *H01L 25/0657* (2013.01); *H01L 2225/06513* (2013.01); *H01L 2225/06541* (2013.01); *H01L 2225/06565* (2013.01); *H01L 21/76898* (2013.01); *H01L 2224/13009* (2013.01)

(58) Field of Classification Search
CPC . H01L 21/76898; H01L 23/481; H01L 24/13; H01L 24/14
USPC ................... 257/508, 506, E29.002, E29.011
See application file for complete search history.

(56) References Cited

U.S. PATENT DOCUMENTS
2010/0164000 A1* 7/2010 Dove ............................ 257/368

FOREIGN PATENT DOCUMENTS
JP    2007-123857     5/2007
JP    2007123857   *  5/2007

* cited by examiner

*Primary Examiner* — David S Blum

(57) ABSTRACT

A semiconductor device includes an isolation portion penetrating a semiconductor substrate from a first surface to a second surface positioned opposite the first surface. The isolation portion includes a first insulating film and a second insulating film. The first insulating film has a slit portion at a side of the first surface and the slit portion is buried with the second insulating film. The semiconductor device further includes an electrode penetrating the semiconductor substrate that is surrounded by the isolation portion.

17 Claims, 19 Drawing Sheets

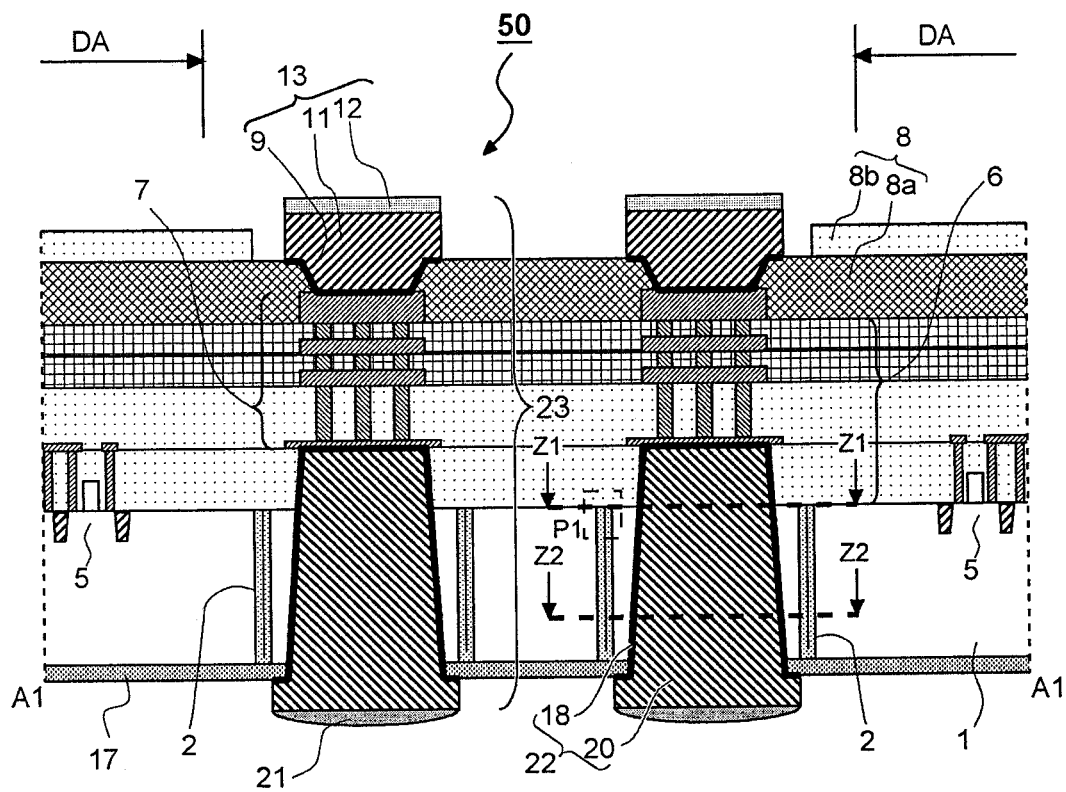
FIG. 1A
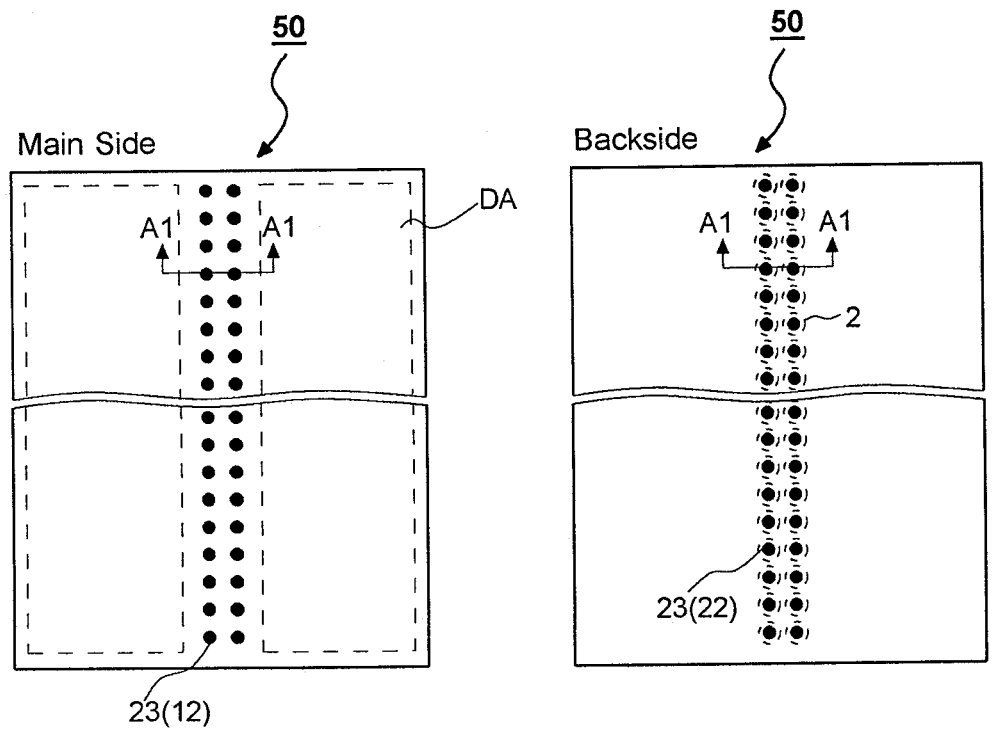
FIG. 1B
FIG. 1C

SEMICONDUCTOR DEVICE HAVING THROUGH-SUBSTRATE VIA WITH INSULATING PORTION

BACKGROUND OF THE INVENTION

1. Field of the Invention

The present invention relates to a semiconductor device, and more particularly, to a semiconductor device having an electrode that extends through a semiconductor substrate.

2. Description of the Related Art

Recently, in response to the high functionality and diversification of semiconductor devices, a semiconductor device that is integrated by stacking a plurality of semiconductor chips in the vertical direction is being proposed. This semiconductor device is designed such that an electrical connection between respective semiconductor chips is formed by a through silicon via (referred to as TSV), which penetrates through the semiconductor substrate of the respective semiconductor chip.

In the meantime, since the TSV is formed so as to extend through the semiconductor substrate, it is required to be designed so that the TSV is insulated from the semiconductor substrate. Therefore, an annular insulating-separation portion (also referred to as an insulating ring) is proposed. The annular insulating-separation portion is formed around the TSV so as to separate the TSV from the semiconductor substrate, which is a device-forming area (JP2007-123857A).

In JP2007-123857A, at the initial stage of all processes, the insulating ring is formed by digging a ring-shaped trench in the depth direction from the surface of the silicon substrate on which a device is to be formed, followed by burying the trench with an insulating film. Afterwards, after the processes of forming a device on the surface of the substrate, forming a wiring layer and forming surface electrodes, the silicon substrate is thinned by grinding from the backside. Here, a structure, in which the insulating ring penetrates through the silicon substrate from the surface to the back surface, is formed by performing backside grinding until the bottom of the insulting ring is exposed from the back surface of the substrate. In addition, a TSV is formed in the inner portion of the insulating ring from the backside so as to penetrate through the silicon substrate.

SUMMARY

When the inventors examined a semiconductor device that has a TSV, which is provided with the above-described insulating ring, the followings were found. The insulating ring that the inventors examined is, for example, a ring-shaped arrangement of an insulating film that has a depth from 40 µm to 50 µm and a width from 2 µm to 3 µm (an aspect ratio from 13 to 25). In order to form such an insulating ring, a trench having the above-described shape (hereinafter, referred to as a TSV trench) is formed in the silicon substrate, and an insulating film such as a silicon oxide film is buried in the TSV trench. Finally, the insulating film deposited on the surface of the substrate is removed by chemical mechanical polishing (CMP), thereby completing an insulating ring. In this process, as described above, a thick silicon oxide film having a thickness of several micrometers must be formed in a deep TSV trench having a depth of several tens of micrometers, the non-uniformity of the thickness of the film is great, and the burying ability may be lowered. In particular, when the silicon oxide film is deposited by a method having a poor coverage, the opening of the TSV trench is closed first, thereby forming large voids. In the meantime, even though the silicon oxide film having good coverage is formed, a seam of the silicon oxide film, which is grown from both sidewalls, is formed at a position that is laterally middle between the both sidewalls of the trench. Microscopically small voids may be included in seam 2S. This seam 2S is widen at the upper portion in the vicinity of the opening of the TSV trench to form a ring-shaped slit (concave portion) as shown in FIG. 9 of Patent Document 1. In addition, even after the insulating film such as the silicon oxide film on the surface of the substrate is polished by CMP, it remains as a ring-shaped slit on the surface of the insulating ring.

According to the examination of the inventors, as described above, a composition that is used in a CMP process, a material removed by polishing, and other residues tend to remain in the slit that is left in the surface of the insulating ring. Such residues may become a cause for dust emission that may occur in the subsequent process. Therefore, there is room for improvement.

In the present invention, the isolation portion is formed by burying a slit portion that is formed in an insulating film, which is formed first in a TSV trench, with another insulating film.

According to an embodiment of the invention, provided is a semiconductor device. The semiconductor device includes a semiconductor substrate including a semiconductor substrate including a first surface and a second surface positioned opposite the first surface; a device element formed on the first surface of the semiconductor substrate; and an isolation portion penetrating the semiconductor substrate from the first surface to the second surface, the isolation portion including a first insulating film and a second insulating film, the first insulating film having a slit portion buried with the second insulating film.

According to another embodiment of the invention, provided is a semiconductor wafer. The semiconductor wafer includes a substrate; a first trench isolation formed at a surface of the substrate being configured to define a first area at the surface, the first trench isolation including a first insulating film; a device component formed on the first area; and a second trench isolation formed at the surface of the substrate being configured to define a second area at the surface, a bottom of the second trench isolation being disposed in deeper position than a bottom of the first trench isolation from the surface, the second trench isolation including a second insulating film and a third insulating film buried in a slit of the second insulating film, a bottom of the third insulating film being disposed in deeper position than the bottom of the first trench isolation and shallower than the bottom of the second trench isolation.

According to a further embodiment of the invention, provided is a semiconductor device. The semiconductor device includes a device-forming area, which is formed on a first surface of a semiconductor substrate; an annular insulating-separation portion having a ring shape when viewed from above, the annular insulating-separation portion extending through a second surface of the semiconductor substrate opposite the first surface; and an electrode extending through the semiconductor substrate, which is surrounded by the annular insulating-separation portion, from the first surface to the second surface, the electrode having terminals exposed to outsides of the first and second surfaces, wherein the annular insulating-separation portion includes a first insulating film, which is buried from the first surface to the second surface, and a second insulating film, which is buried in a ring-shaped hole of the first insulating film, which is formed at a predetermined depth from a side of the first surface.

According to an embodiment of the invention, since a slit, which has been formed on the upper portion of a first insulating film burying in an isolation portion, is buried with a second insulating film before CMP, it is possible to prevent components that are used in a CMP process, a material removed by polishing, and other residues from remaining in the slit. Accordingly, it is possible to reduce the dust emission in the subsequent process. As a result, it is possible to increase the yield of the fabrication of a semiconductor device that has a TSV, which is provided with the isolation portion.

BRIEF DESCRIPTION OF THE DRAWINGS

The above features and advantages of the present invention will be more apparent from the following description of certain preferred embodiments taken in conjunction with the accompanying drawings, in which:

FIG. 1A shows a schematic cross-sectional view of a semiconductor chip 50 according to an embodiment of the invention, FIG. 1B shows a top plan view at the side of the first surface, FIG. 1C is a top plan view at the side of the second surface.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Herein, a semiconductor device of this embodiment is characterized in that a silicon (Si) substrate is used as a semiconductor substrate, which acts as a base. In addition, not only an integral semiconductor substrate but also the state in which a semiconductor device element (component) is being fabricated on the semiconductor substrate and the state in which a semiconductor device element is formed on the semiconductor substrate are collectively referred to as a wafer. In addition, a unitary body of a semiconductor device according to this embodiment, which is cut from a wafer, is collectively referred to as a semiconductor chip.

First Exemplary Embodiment

Figure 1D:
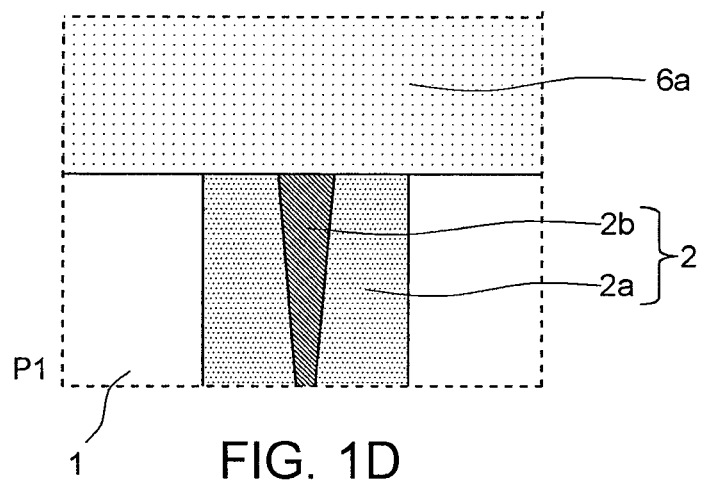
FIG. 1D is a partially enlarged cross-sectional view of the semiconductor chip 50.
Figure 1E:
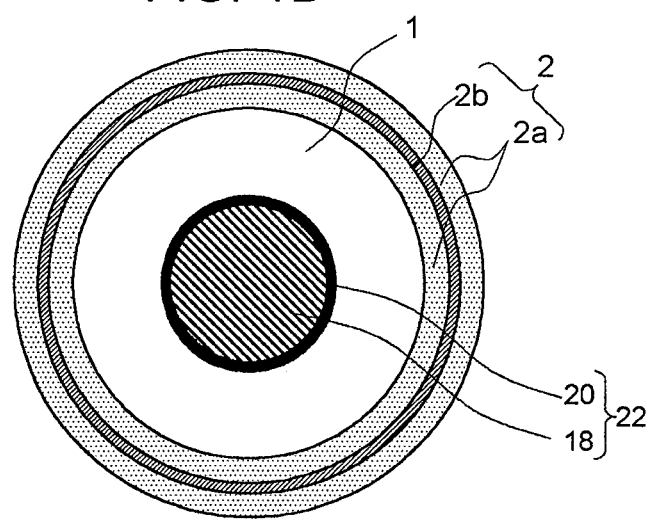
FIGS. 1E and 1F show cross-sectional views taken along Z1-Z1 and Z2-Z2 lines, respectively.
Figure 1F:
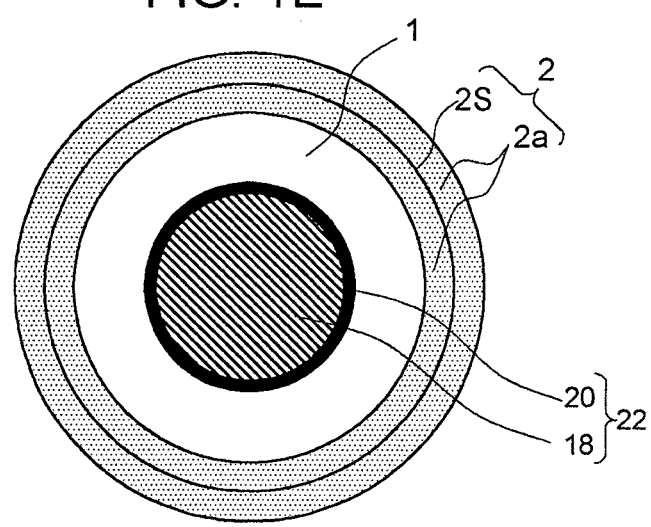

FIG. 1 depicts an example of a semiconductor device (semiconductor chip 50) having a TSV structure to which the invention is applied, in which FIG. 1A is a schematic cross-sectional view depicting a TSV structure part, FIG. 1B shows a top plan view at the side of the first surface, FIG. 1C is a top plan view at the side of the second surface. FIG. 1A corresponds to a cross-sectional view taken along A1-A1 line in FIG. 1B and FIG. 1C. FIG. 1D corresponds to an enlarged view of portion P1 of FIG. 1A, and FIG. 1E and FIG. 1F correspond to horizontal cross-sectional views taken along Z1-Z1 and Z2-Z2 lines in FIG. 1A, respectively.

A semiconductor substrate 1 is provided with isolation portions (referred to as an insulating ring) 2 that have an annular structure when viewed from above. Each insulating ring 2 insulates and separates a first semiconductor area (TSV forming area) from a second semiconductor area (device area DA). The TSV 22, which is composed of a seed layer 18 and a Cu plug 20, is formed in the TSV forming area, which is surrounded by the insulating ring 2. Although this example is illustrated that the TSV 22 is formed integrally with an external terminal (bump portion), the TSV may be formed separate from the external terminal. A solder film (Sn—Ag alloy layer) 21 is formed on the surface of the bump portion of the TSV 22.

In the meantime, a wiring structure 7, which is composed of conductive lines and plugs in an interlayer insulating film 6, is formed in the main side on which a semiconductor device element 5 is formed. The interlayer insulating film 6 is made of silicon oxide or the like. The lowermost layer of the wiring structure 7 is a pad electrode that is connected to the TSV 22, and is made of a metal, for example, tungsten (W). The upper wiring layer may be made of a conductor such as aluminum (Al). The uppermost portion of the wiring structure 7 is covered with a surface protective film 8 (a silicon nitride film 8a and a passivation film 8b). The surface protective film 8 has an opening, which exposes the uppermost portion of the wiring structure 6, and a bump electrode 12 is formed in the opening. The bump electrode 12 is composed of a seed layer 8, a Cu layer 10, which is a main portion, and a Ni layer 11. Here, portions from the TSV 22 at the backside to the bump electrode 12 at the main side are referred to as a TSV structure 23.

Although the example shown in FIG. 1 illustrates a structure in which two rows of a plurality of TSV structures 23 are arrayed in the central portion of the semiconductor chip 50, this is not intended to be limiting.

The insulating ring 2 is configured such that a first insulating film 2a is buried in a trench (a first trench 2T), which is formed from the side of the first surface of the semiconductor substrate 1. However, as shown in FIG. 1D and FIG. 1E, a second insulating film 2b is formed so as to bury a ring-shaped hole (a slit 2ST) of the first insulating film 2a. In the meantime, at a predetermined depth from the side of the first surface, as shown in FIG. 1F, the second insulating film 2b is not present, but a seam 2S, which is formed by growing the first insulating film 2a from both sides of the first trench 2T as a bonding plane of the first insulating films 2a, exists. In addition, 6a indicates the lowermost layer of the interlayer insulating film 6 (on the first surface of the semiconductor substrate 1). As shown in FIG. 1E and FIG. 1F, this exemplary embodiment illustrates the isolation portion (insulating ring) that has a circular shape when viewed from above the first surface (overlooking view). However, another ring-shaped structure such as a rectangular ring shape as an overlooking view can be used.

Figure 9:
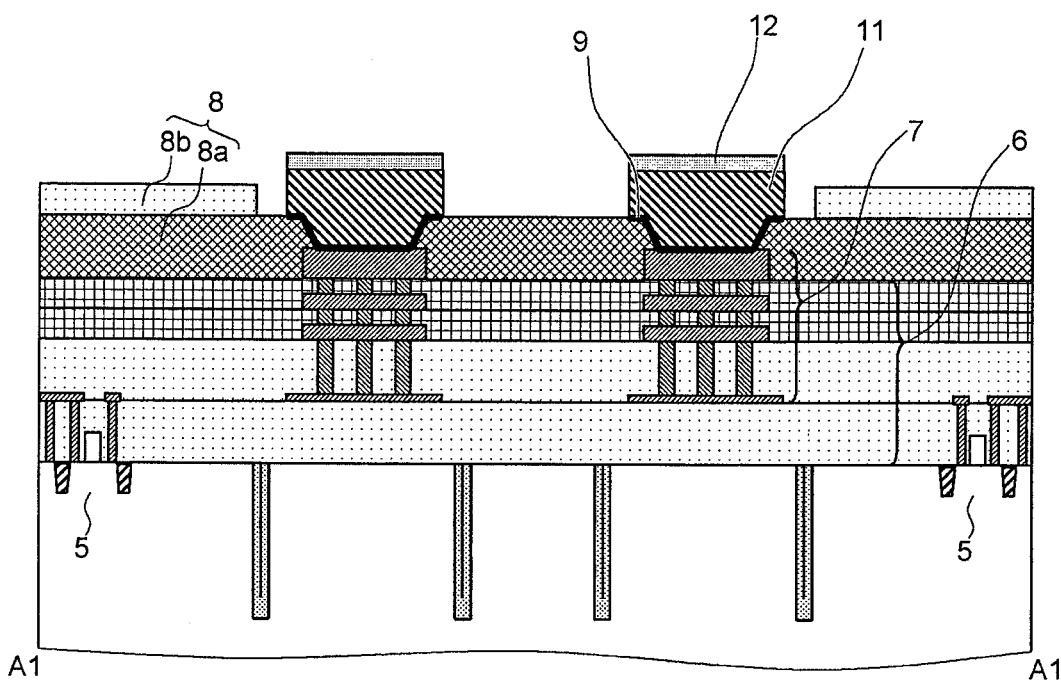
FIG. 9 and FIG. 10 show schematic cross-sectional views illustrating the state of the semiconductor chip 50 according to an embodiment of the invention after the fabrication process, in particular, after the formation of the insulating ring.
Figure 10:
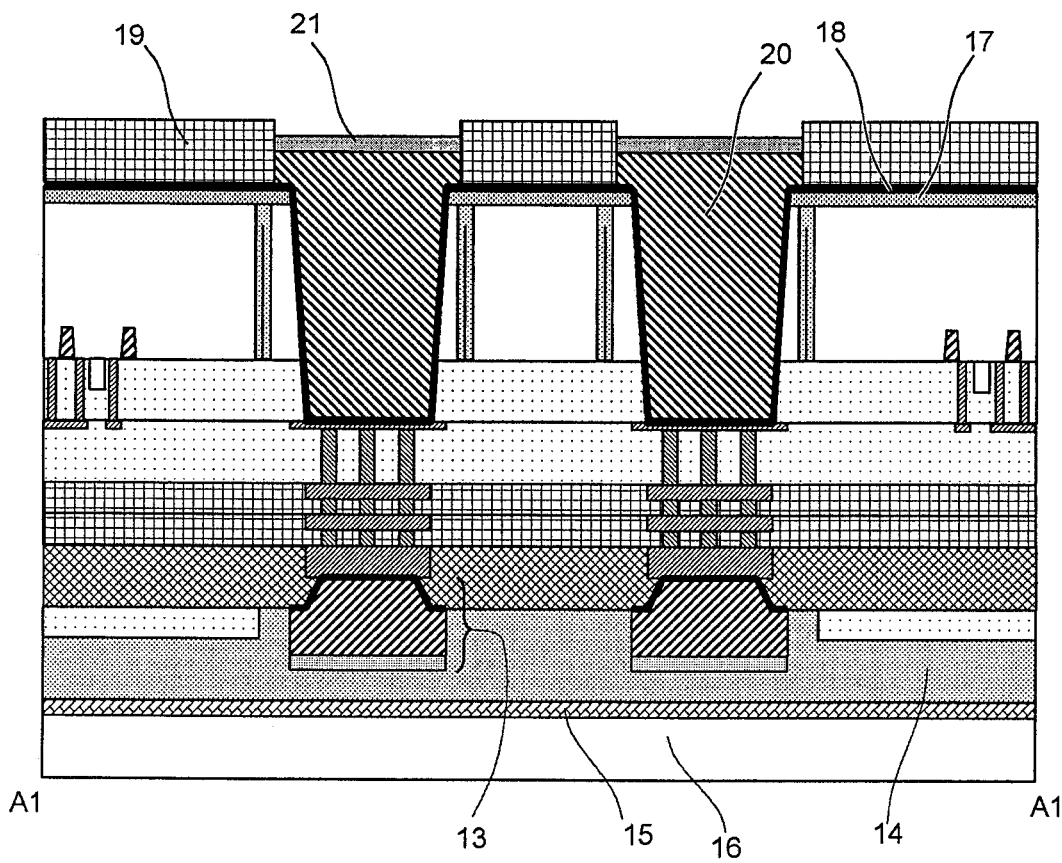
Figure 11B:
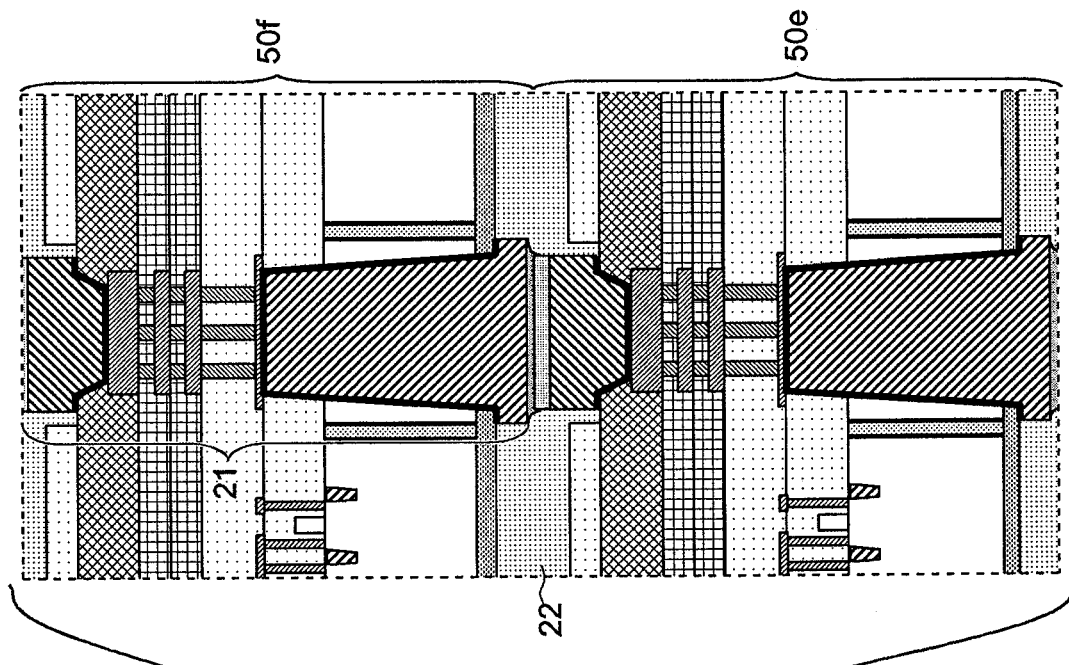
FIG. 11B shows a partially-enlarged view thereof.
Figure 11A:
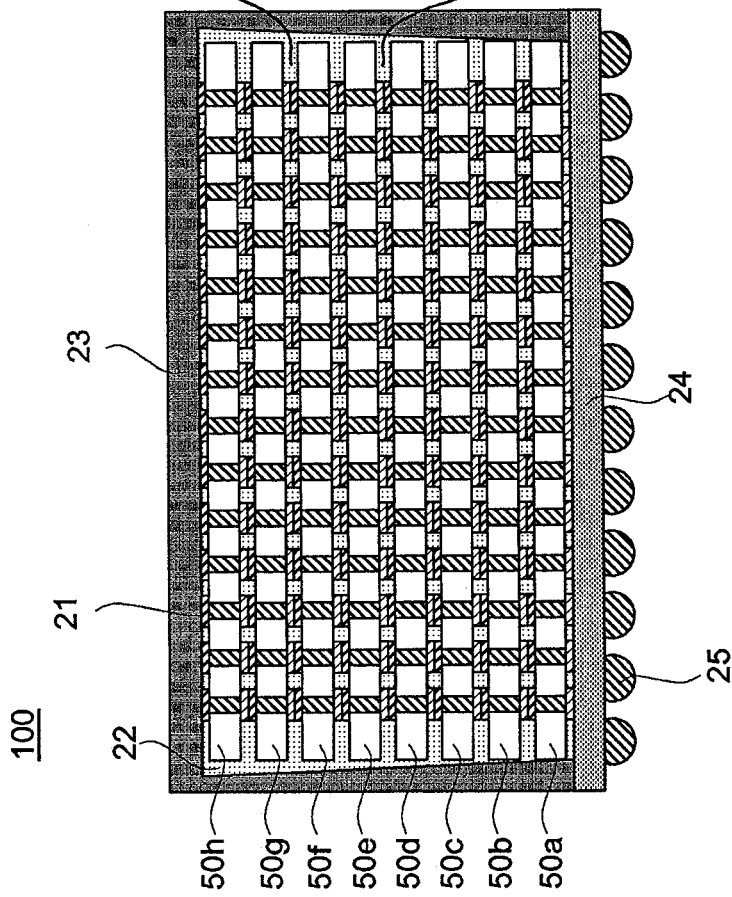
FIG. 11A shows a schematic cross-sectional view of a semiconductor module 100 using the semiconductor chip 50 according to an embodiment of the invention.

A description will be given below of a method of fabricating the semiconductor chip 50 and a method of fabricating a semiconductor module 100, which is formed by stacking a plurality of semiconductor chips 50. FIG. 2 to FIG. 8 are process cross-sectional views depicting a fabrication process of a semiconductor chip, and respective sub-figures A and B thereof correspond to FIG. 1A and FIG. 1D. FIG. 9 and FIG. 10 are schematic cross-sectional views depicting a fabrication process after the insulating ring 2 is formed, and correspond to FIG. 1A. FIG. 11A is a schematic cross-sectional view of the semiconductor module 100, which is packaged by stacking a plurality of semiconductor chips 50a to 50h on each other and connecting the semiconductor chips 50a to 50h to each other, and FIG. 11B is a partially-enlarged view thereof.

Figure 2A:
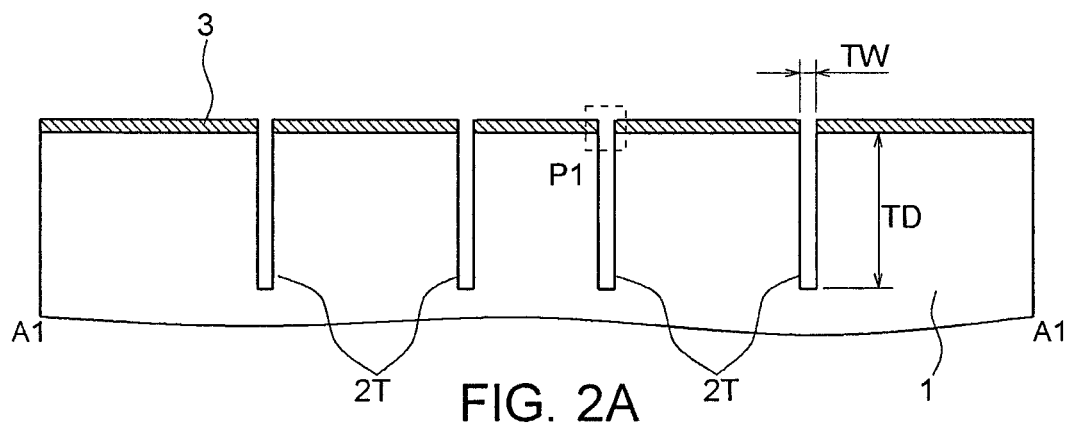
FIGS. 2A, 3A, 4A, 5A, 6A, 7A and 8A show process cross-sectional views depicting the process of fabricating a semiconductor chip 50, in particular, an insulating ring according to an embodiment of the invention.
Figure 2B:
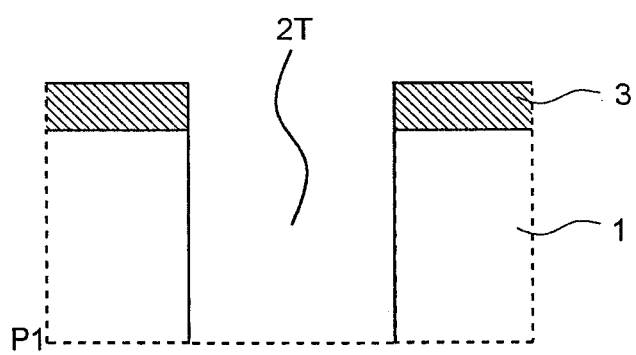
FIGS. 2B, 3B, 4B, 5B, 6B, 7B and 8B show respective partially-enlarged views thereof.

First, as shown in FIG. 2, first trenches 2T, which are intended to form the insulating rings 2, are formed from the side of the first surface of the semiconductor substrate 1. The shape of the first trenches 2T may include, for example, a width 2 µm and a depth 50 µm. Prior to the formation of the first trenches 2T, the first surface of the semiconductor substrate 1 is thermally oxidized, thereby forming a silicon oxide film 3, which acts as a hard mask. The patterning of the silicon oxide film 3 includes forming the pattern of the first trenches 2T by photolithography using a photoresist (which is not shown), patterning the silicon oxide film 3 by dry etching, and then forming the first trenches 2T to a predetermined depth by dry etching the semiconductor substrate 1.

Figure 3A:
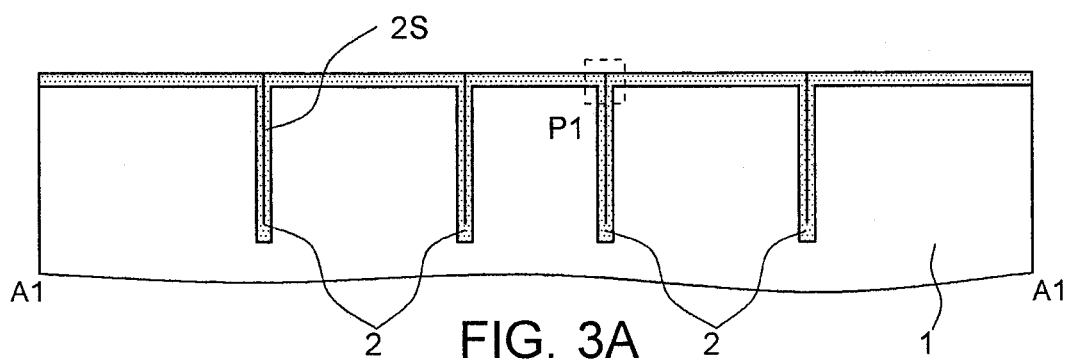
Figure 3B:
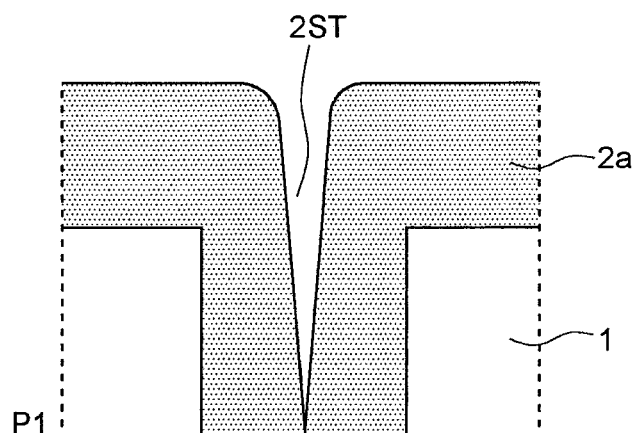

In sequence, as shown in FIG. 3, using TEOS as a source gas, a non-doped silicate glass (TEOS-NSG) film, which is formed by low-pressure CVD, is formed as the first insulating film 2a to a film thickness that buries the inside of the first trenches 2T. In this embodiment, the TEOS-NSG film is formed at a film thickness of 1.76 µm. The thickness of the first insulating film 2a (the thickness of the film on the mask silicon oxide film 3), which is formed by such a deposition method, is a film thickness of ½ or greater than the width of the first trenches 2T in terms that the first trenches 2T are completely buried. Here, the TEOS-NSG film is used as the first insulating film 2a because it can be formed so as to have good coverage and be conformal in order to prevent the occurrence of voids as much as possible when burying a trench having a high aspect ratio. Other materials can be used as long as they achieve the equivalent effects.

However, in the insulating film that is formed conformally as described above, when a trench having a high aspect ratio as described in the related art section, the slit 2ST remains at a depth of several micrometers in the upper portion thereof, in the middle of the width of the trench. That is, the slit 2ST is formed by dividing the first insulating film 2a on the seam 2S at the side of the first surface. When planarized in this state by CMP, this may be a factor that causes dust emission as described in the related art section. Therefore, the invention reduces the dust emission during the CMP by burying the slit 2ST in advance using the second insulating film.

Figure 4A:
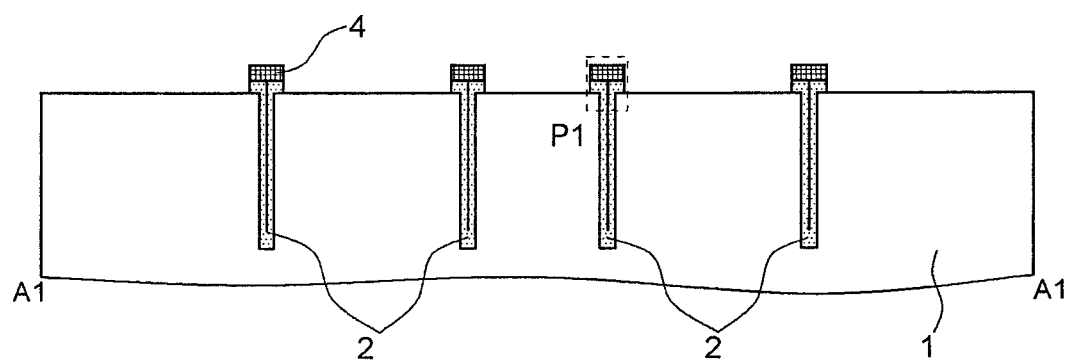
Figure 4B:
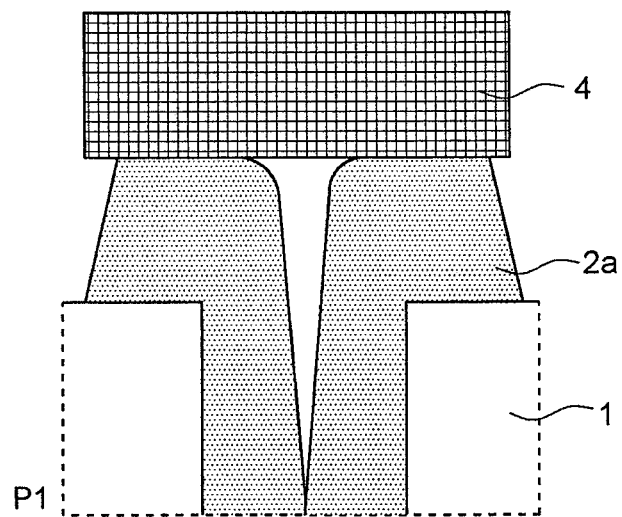

In sequence, as shown in FIG. 4, the film thickness of the TEOS-NSG film is reduced by wet etching in order to reduce the load of the CMP when removing the TEOS-NSG film on the surface of the substrate by subsequent polishing. However, since a TSV trench portion has the seam 2S, the slit 2ST is deepened when the wet etching is performed in this state. Therefore, the TSV trench portion is protected using a protective film 4, such as a photoresist or the like. In addition, when the load of the CMP is not problematic, the process shown in FIG. 4 may be omitted.

Although there is a case in the related art that such a process of reducing the load of the CMP is carried out, in that case, the TEOS-NSG film is left on the substrate without being completely removed. This is in order to prevent the substrate surface from being exposed to the polishing in the subsequent CMP process. However, depending on the film thickness of the TEOS-NSG film, which is left by the wet etching, it is a concern that the subsequent CMP polishing might be non-uniform.

Figure 6A:
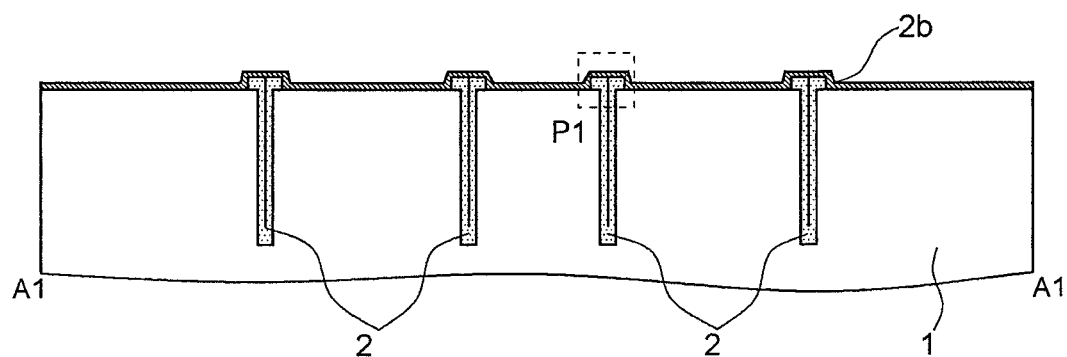
Figure 6B:
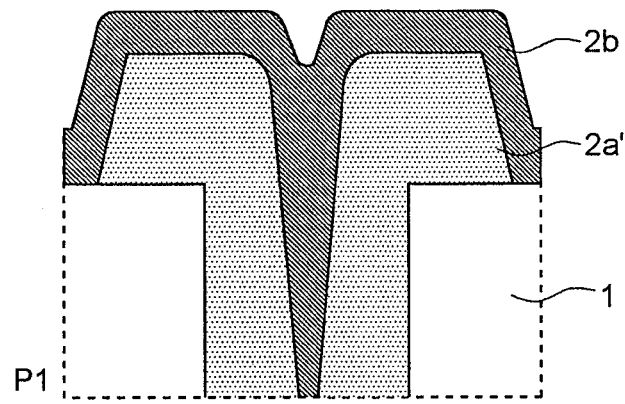

In contrast, in the process of this embodiment, after the wet etching intended to decrease the stepped portion of the TEOS-NSG film, the second insulating film is deposited as in the process shown in FIG. 6. Therefore, it is not required to leave the TEOS-NSG film on the substrate in the wet etching intended to decrease the stepped portion. Since the film that is deposited on the substrate by CVD is uniform compared to the film that is left on the substrate by the wet etching, it is possible to improve the uniformity of the polishing in the subsequent CMP process.

Figure 5A:
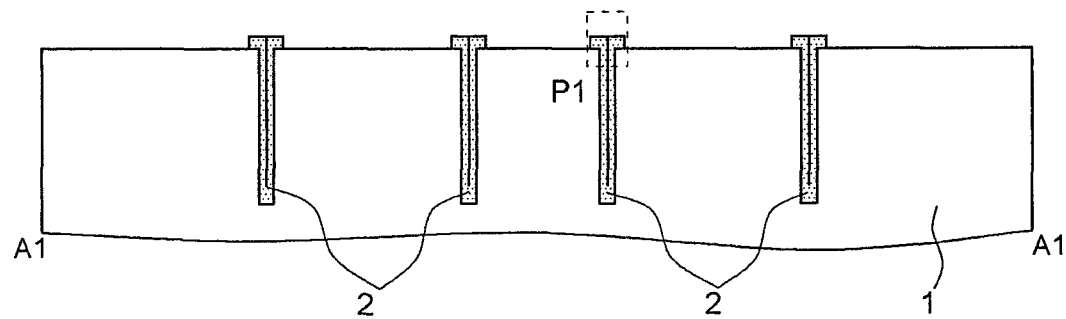
Figure 5B:
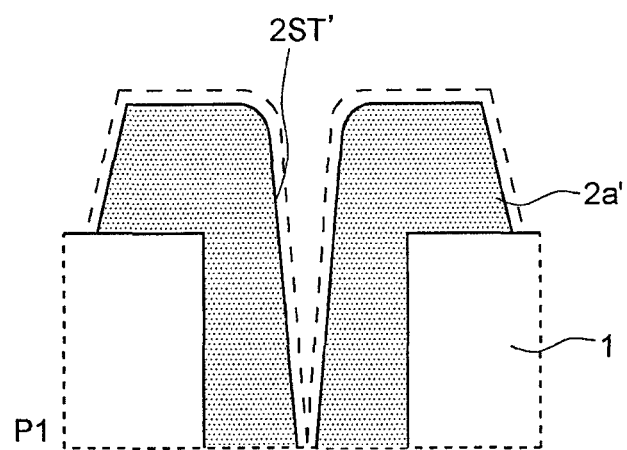

After the first insulating film (TEOS-NSG film) 2a other than the TSV portion is removed, degassing heat treatment is performed, as shown in FIG. 5. For example, the heat treatment is performed for 60 minutes at 950° C. When such heat treatment is performed, the TEOS-NSG film is shrunk, and the slit 2ST is enlarged.

Afterwards, as shown in FIG. 6, a BPSG film is formed as the second insulating film 2b on the entire portion of the first surface. The BPSG film is made of TEOS, and is formed by CVD by introducing intended amounts of $PH_3$, $B_2H_6$ and $O_2$ into a film-forming space. In addition, the material for the second insulating film is not limited to the BPSG film as long as it is an insulating material that can be reflowed as described in the subsequent process. For example, the material may be a PSG film that contains phosphorus or a BSG film that contains boron. In addition, in this step, the second insulating film 2b also has a slight slit shape depending on the slit shape of the first insulating film 2a.

Figure 7A:
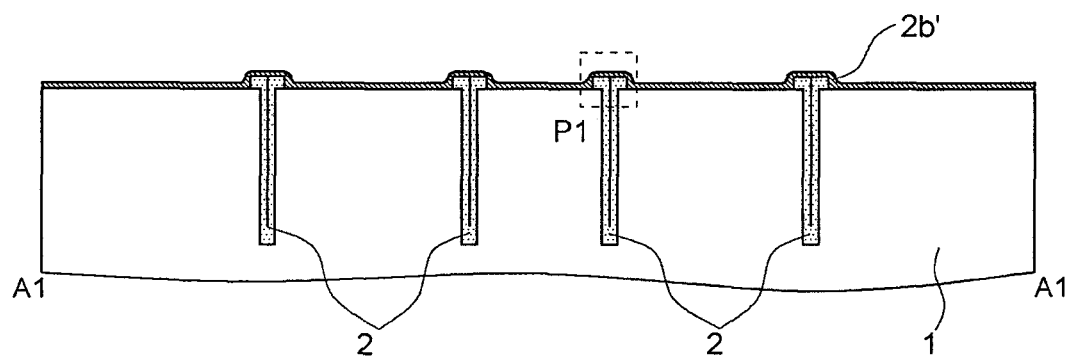
Figure 7B:
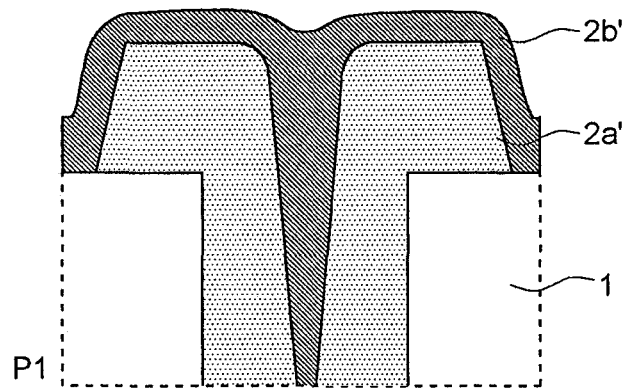

In sequence, as shown in FIG. 7, the second insulating film (BPSG film) 2b is subjected to reflow by heat treatment at 900° C. for 30 minutes. Due to the reflow, the slit shape remaining on the second insulating film is further smoothened.

Figure 8A:
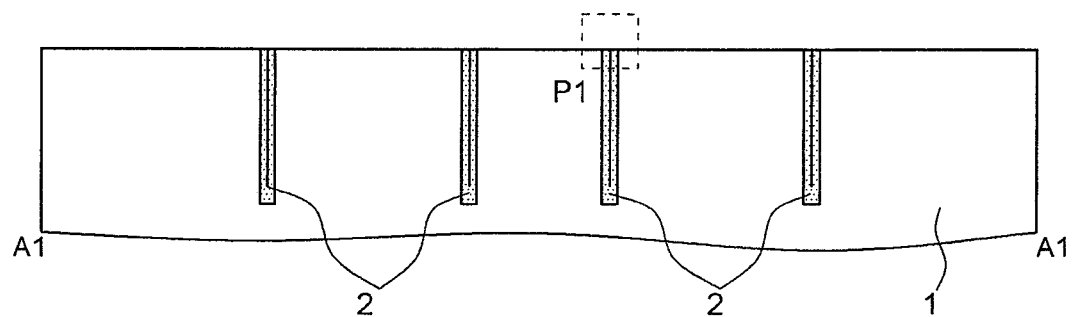
Figure 8B:
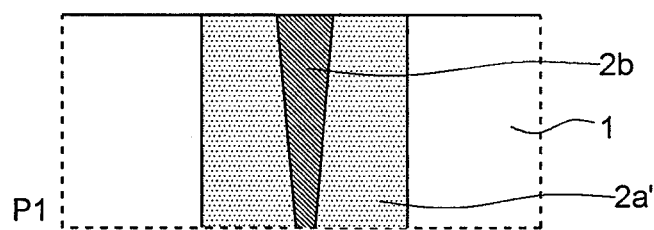

Finally, as shown in FIG. 8, the insulating ring 2 is completed by removing the second insulating film 2b and the first insulating film 2a on the first surface of the semiconductor substrate 1 by chemical-mechanical polishing (CMP).

A subsequent process will be described with reference to FIG. 9. The semiconductor device element 5 is formed on the first surface of the semiconductor substrate 1, and the wiring structure 7 is formed in the interlayer insulating film 6. For example, in the case of the semiconductor device having DRAM, a capacitor device (not shown) or the like may be formed. In sequence, after the silicon nitride film 8a and the polyimide film 8b (passivation film) are formed, an opening for a bump electrode is formed by a typical photolithography process or the like. A Cu film 11, a Ni/Au film 12 and the like are continuously formed by electrolytic plating using a metal seed layer 9 (Cu/Ti), which is formed by sputtering or the like. Here, a bump-shaped electrode may be formed by performing electrolytic plating inside a resist film, which is patterned in advance by photolithography or the like.

A subsequent process will be described with reference to FIG. 10. The semiconductor substrate 1 is thinned by grinding from the second surface (back surface) side in the state in which the semiconductor substrate 1 is supported by a wafer supporting system (WSS) 16 that is bonded to the surface with an adhesive layer 14 and a light-to-heat converter (LTHC) 15 being interposed therebetween. For example, one end (bottom portion) in the backside of the insulating ring 2, which is formed in advance, is exposed by thinning, for example, until the range from about 40 μm to about 100 μm thickness of the semiconductor substrate 1. In sequence, a backside protective film 17 (e.g. a silicon nitride film) is formed on the backside of the substrate. Afterwards, a hole for forming the TSV is formed in an area of the substrate that is surrounded by the insulating ring 2. In addition, in the same fashion as the method by which the bump electrodes are formed, the metal seed layer 18 (Cu/Ti), the Cu plug 20 and the solder film 21 (Sn—Ag alloy) are formed. In this fashion, the TSV 22 is formed. Finally, the WSS 16 is removed, and dicing is performed, thereby cutting the substrate into individual semiconductor chips 50. As described above, the structure shown in FIG. 1 is formed.

The individual semiconductor chips are stacked on each other, as shown in FIG. 11A, and the solder film 21 is reflowed in the pressurized state. This indicates the bonded state of the semiconductor chips, which are fabricated by the above-described method and have the same TSV structure.

The bump electrode 13 (the Ni/Au film 12) on the main side and the bump portion (solder film 21) of the TSV 22 of each semiconductor chip are aligned in positions. While the bump electrode 13 and the bump portion are being pushed down under a predetermined pressure, a temperature ranging from a melting point of the solder or higher to 300° C. is applied, thereby reflowing the solder film 21. As above, the TSV structures are bonded to each other. The pressure (load) that is applied in the bonding is in the range that does not influence the TSV structure, in particular, the wiring structure 7. For example, the pressure is set to the range from 10 g to 150 g per one bump electrode. In addition, a heating means is selected from the use of a reflow furnace or oven, thermal radiation from a halogen lamp, the contact of a heating body, or the like, but is not specifically limited.

Finally, an underfill resin 24 is filled between the respective semiconductor chips. In sequence, the outer terminal of the TSV 23 of the lowermost semiconductor chip 50a is connected to a package substrate 26, and a ball grid array (BGA) 27 including solder balls is formed, thereby completing the semiconductor module 100, as shown in FIG. 11. FIG. 11A illustrates the case in which eight semiconductor chips 50a to 50h are stacked on each other, and FIG. 11B shows part thereof in an enlarged view.

In addition, although the case in which the first insulating film 2a is mainly used as the insulating ring is described, a silicon nitride film or the like may be formed as a barrier layer that prevents metal diffusion from the TSV before the formation of the first insulating film 2a.

Although eight semiconductor chips 50a to 50h are stacked on each other in the structure that is described with reference to FIG. 11A, the effective structure to which the invention is applied is not limited to the number of the chips that are stacked on each other. For example, four chips (for example, the semiconductor chips 50e to 50h in FIG. 11A) may have the same circuit function, and one chip (the semiconductor chip 50d) may have the function to control them. In addition, the TSV 23 is used in order to supply a signal or power that is supplied from the lower layer (or the upper layer) of a chip, which has the same electrode, to another chip in the upper layer (or the lower layer). At this point of view, the semiconductor chip 50h in the uppermost layer may be configured such that it can store the signal or power from the semiconductor chip 50g in the lower layer in the chip thereof, and supply a signal from the chip thereof to the semiconductor chip 50g in the lower layer. For this, it is sufficient for the semiconductor chip 50h to have a pad that can be electrically connected to the device elements of the chip thereof and be electrically connected to the semiconductor chip 50g in the lower layer. Therefore, the semiconductor chip 50h in the uppermost layer may be configured so as not to have the TSV 23. In the case of the structure without the TSV 23, it is not required for thinning the semiconductor chip 50h. That is, it is possible to simplify the process of fabricating the semiconductor device by omitting some processes, from the thinning process to the TSV-forming process. In addition, the processes from the thinning process to the TSV-forming process are performed after the entire processes from the device-forming process, to the wiring process and to the pad-forming process for the first surface of the substrate are completed. Therefore, although these processes are omitted from the semiconductor chip 50h, functions such as the circuit structure can be obtained the same as those of other semiconductor chips. In addition, since the thinning process of the semiconductor chip 50h in the uppermost layer is omitted, it is possible to reduce warping in the substrate or deformation in the substrate, owing to thermal stress when the chips are stacked on each other. Furthermore, at the point of view that all the semiconductor chips are formed to the same with the completely same structure, it is also possible to provide the TSV by thinning the semiconductor chip 50h in the uppermost layer in the same fashion as in the lower layer.

Modified Example 1

Figure 12A:
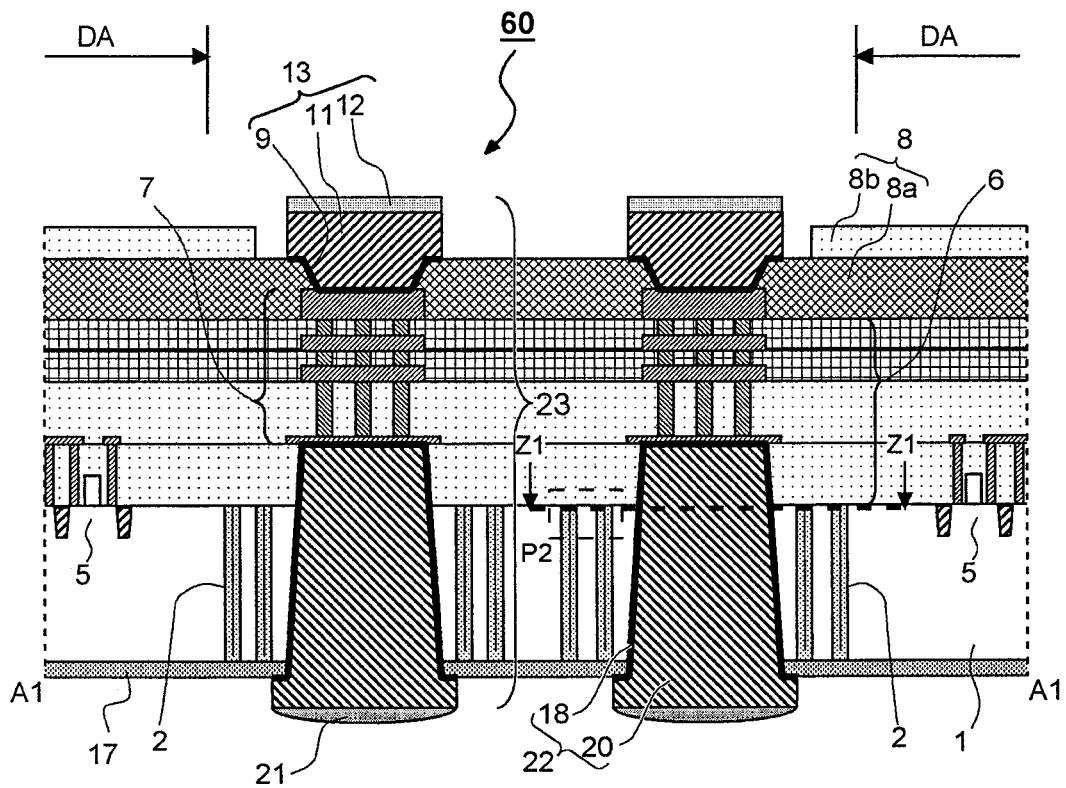
FIG. 12A shows a schematic cross-sectional view of a semiconductor chip 60 according to a modified example 1 of an embodiment of the invention.
Figure 12B:
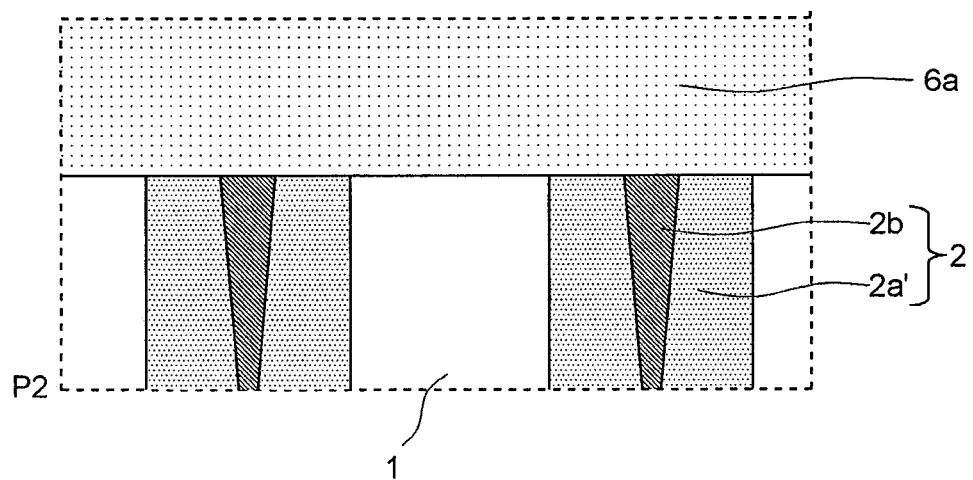
FIG. 12B shows a partially-enlarged view thereof.
Figure 12C:
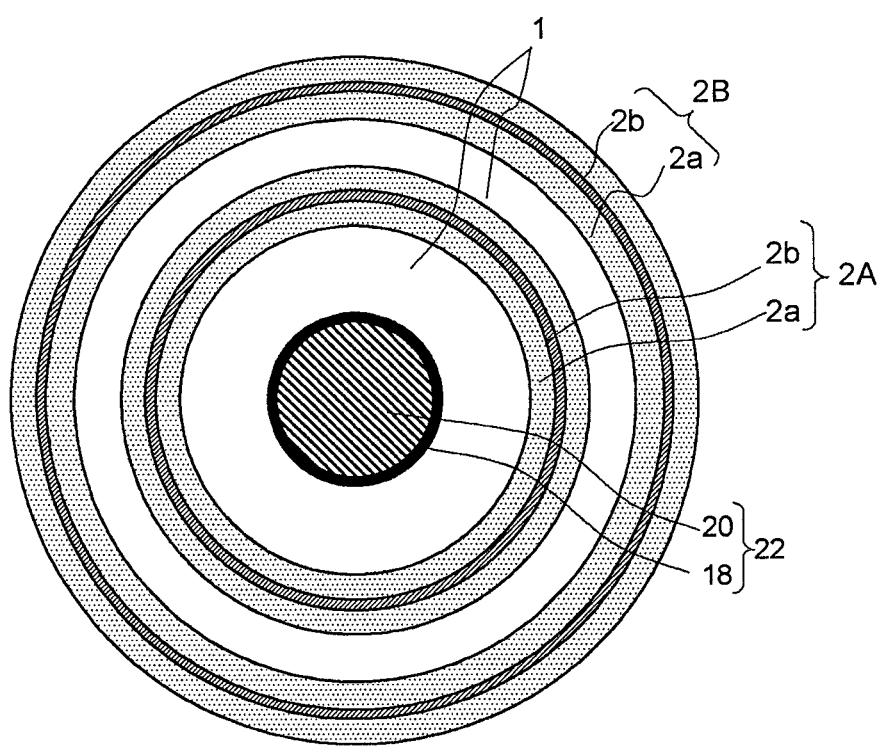
FIG. 12C shows a cross-sectional view along Z1-Z1 line in FIG. 12A.

In addition, although the insulating ring 2 is illustrated as having a single ring structure in the first exemplary embodiment, this is not intended to be limiting. Rather, the insulating ring 2 may have a multiple ring structure. In an example, FIG. 12A is a schematic cross-sectional view of a semiconductor chip 60 that has a double-ring structure, FIG. 12B shows a partially-enlarged view of part P2, and FIG. 12C shows a cross-sectional view along Z1-Z1 line in FIG. 12A. The insulating ring includes an inner insulating ring 2A and an outer insulating ring 2B. In each surface, the second insulating film 2b is formed in a groove-shaped slit (hole) in the middle of the width of the insulating ring.

Modified Example 2

In the foregoing embodiment, a vertical trench (TSV trench) 2T is formed as the shape of the trench for the insulating ring. However, in response to recent miniaturization of semiconductor devices, the size of the opening of the TSV trench tends to decrease and the aspect ratio of the opening tends to increase further. Because of this, when the first insulating film 2a is filled in the vertical TSV trench by CVD, the first insulating films 2a, which are deposited on the upper portion of the opening, come into contact with each other, so that cavities (voids) tend to remain in the lower portion. When such voids are created, the bonding force in a seam 2S tends to be decreased, and the area surrounded by the insulating ring tends to be isolated. This tends to be a reason by which cracks or the like occur in the interlayer insulating film 6 or the like in the subsequent manufacturing process. Therefore, it is effective to process the upper portion of the opening of the TSV trench into a tapered shape.

Figure 13A:
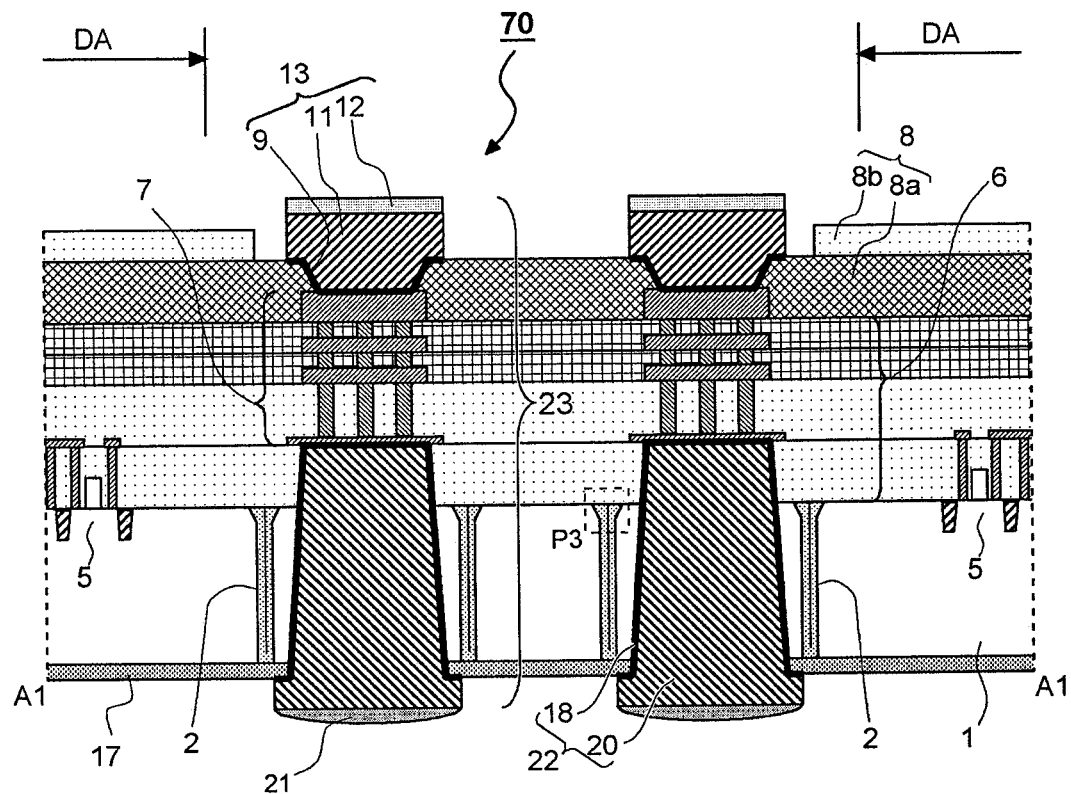
FIG. 13A shows a schematic cross-sectional view of a semiconductor chip 70 according to a modified example 2 of an embodiment of the invention.
Figure 13B:
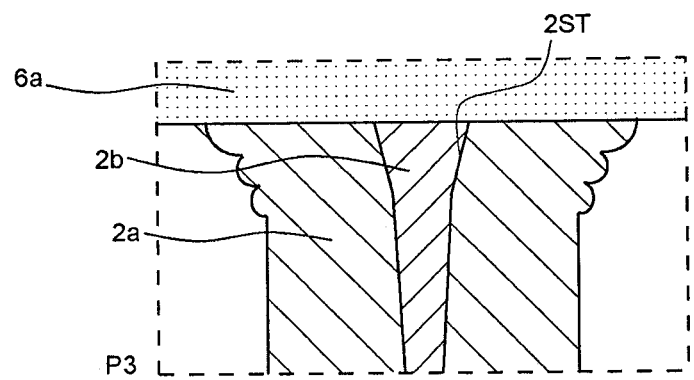
FIG. 13B shows a partially-enlarged view thereof.

FIG. 13A shows a schematic cross-sectional view of a semiconductor chip 70 having the insulating ring 2, in which the upper portion of the opening of the TSV trench is tapered, and FIG. 13B shows a partially-enlarged view of the upper portion P3 of the opening of the TSV trench. Here, a description will be given of a method of forming the upper portion of the opening of the TSV trench into the shape that is substantially tapered by a method, which is referred to as the Bosch process.

The Bosch process is a technology that vertically and deeply etches a semiconductor substrate by repeating an etch process of forming an opening by isotropically etching the surface of the semiconductor substrate 1 and a deposition process of depositing a carbon polymer-based protective film on the inner wall of the opening. In the Bosch process, a waved cross-section, which is referred to as scalloping, is formed in the side surface of the opening.

Referring to FIG. 14, a method of forming an insulating ring using this Bosch process will be described. FIG. 14A to FIG. 14H correspond to the upper portion P3 of the opening of the TSV trench in FIG. 13B, respectively.

First, a hard mask 3 having the shape the same as that of the first embodiment is formed on the semiconductor substrate 1 made of silicon. The semiconductor substrate 1 is isotropically etched via the opening (TSV trench-forming portion), which is not covered with the hard mask 3. Here, an opening 2T-1 having a predetermined depth is formed by performing highly-isotropic dry etching. For example, it is possible to perform highly-isotropic etching by promoting side etching by setting bias power, which strengthens anisotropy, to be weak using a single wafer processing ICP high-density plasma etching apparatus (FIG. 14A).

Afterwards, a protective film (a deposition film 2Dp), which covers the inner wall of the opening 2T-1, is formed. The deposition film 2Dp is implemented as a fluorocarbon-based polymer film. Here, a deposition film 2Dp is also formed on the hard mask 3.

Figure 14A:
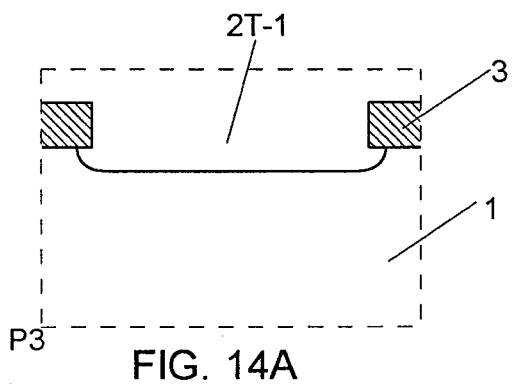
FIG. 14A to FIG. 14H show process cross-sectional views depicting the process of fabricating a semiconductor chip 70 according to a modified example 2 of an embodiment of the invention.
Figure 14E:
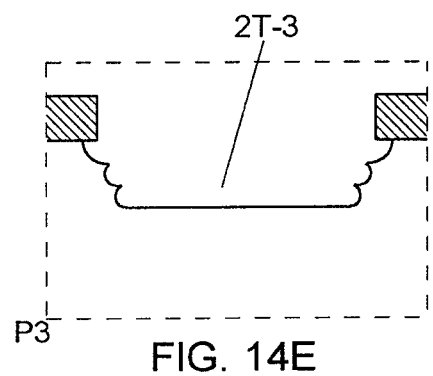
Figure 14B:
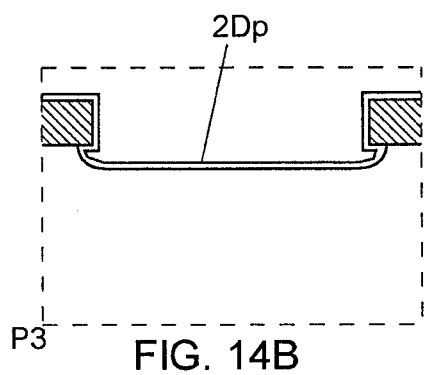
Figure 14F:
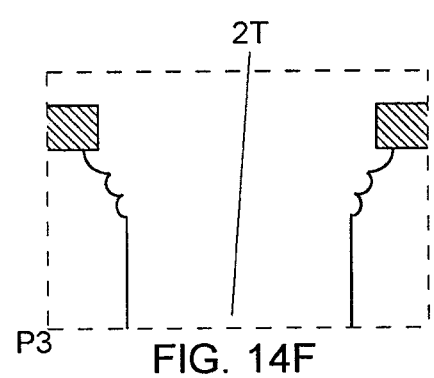
Figure 14C:
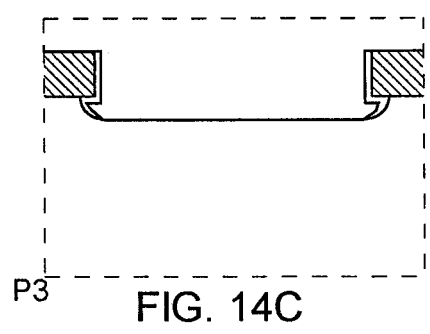
Figure 14G:
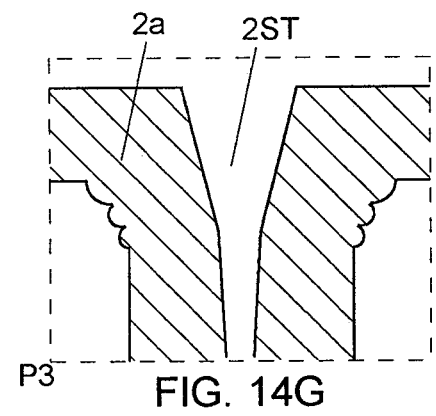

In sequence, dry etching, in which anisotropy is slightly strengthened, is performed using a gas the same as in the etching of the process in FIG. 14A, thereby removing the deposition film 2Dp, which is deposited on the bottom surface of the opening 2T-1 (FIG. 14C). Here, the deposition film 2Dp on the hard mask 3 is also removed.

Figure 14D:
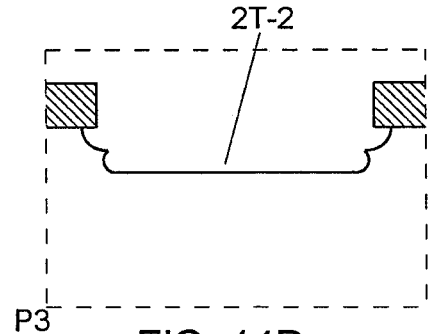

In addition, an opening 2T-2 is forming by etching the opening 2T-1 below the exposed semiconductor substrate 1 (FIG. 14D). The amount by which the opening 2T-2 is etched is smaller than the amount by which the opening 2T-1 is etched.

Likewise, an opening 2T-3 is formed by depositing a deposition film, removing the deposition film on the bottom of the opening 2T-2, and etching the exposed semiconductor substrate by further strengthening the isotropy of the etching (FIG. 14E).

In the subsequent cycles, the processes of depositing the deposition film and etching are sequentially repeated by setting a short etching time, thereby forming a TSV trench 2T that is substantially vertical (FIG. 14F). In addition, it is possible to remove the residual deposition film by etching or the like using an oxygen gas at the last stage.

Figure 14H:
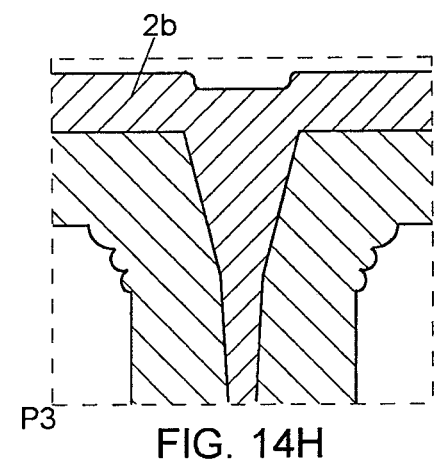

After that, in the same fashion as in the first embodiment, the hard mask 3 is removed, the first insulating film 2a is deposited (FIG. 14G), the first insulating film 2a on the semiconductor substrate 1 except for the TSV trench portion is removed as required, and degassing annealing is performed. Afterwards, the processes of depositing and reflowing the second insulating film 2b are performed (FIG. 14H). After that, planarization is performed by CMP, thereby completing the insulating ring according to the modified example 2 (see FIG. 13B).

Second Exemplary Embodiment

In the first exemplary embodiment, the insulating film, which contains impurities such as the BPSG film, is exposed as the second insulating film 2b on the first surface of the semiconductor substrate 1. When the insulating film, which contains impurities as above, is exposed to the surface, impurities, such as boron (B) or phosphorus (P), diffuse outwards in the subsequent device-forming process. This may cause pollution in a film-forming device or diffusion into a gate oxide film, thereby varying electrical characteristics or affecting reliability. Therefore, in the second exemplary embodiment, a description will be given of a method of preventing impurities from diffusing outwards.

Figure 15A:
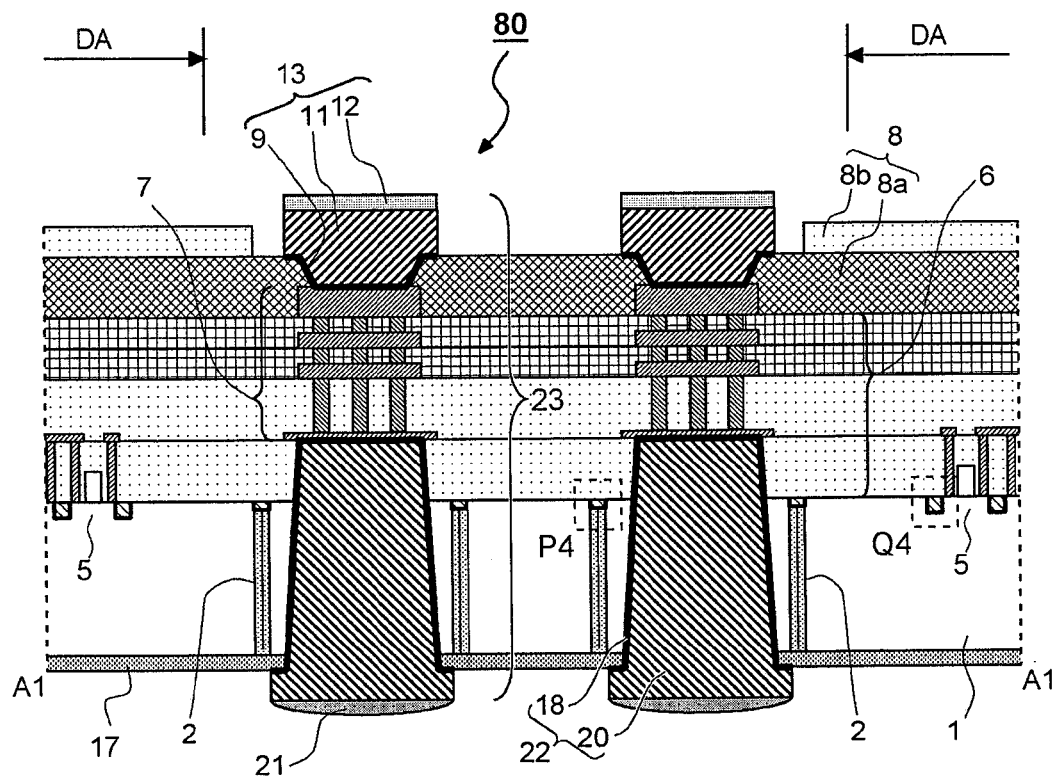
FIG. 15A shows a schematic cross-sectional view of a semiconductor chip 80 according to another embodiment of the invention.
Figure 15B:
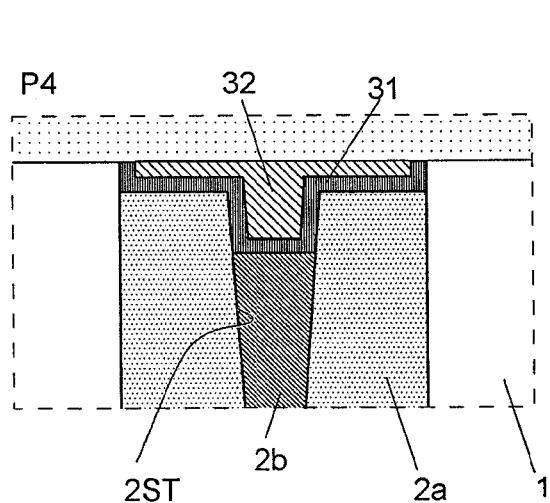
FIG. 15B and FIG. 15C show a partially-enlarged view thereof.
Figure 15C:
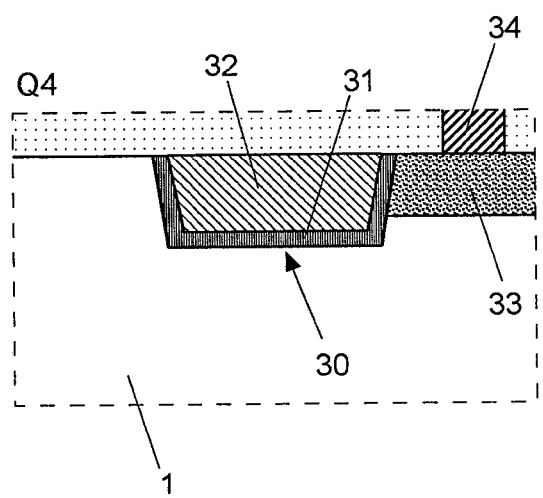

FIG. 15A shows a schematic cross-sectional view of a semiconductor chip 80 according to this second exemplary embodiment, FIG. 15B shows a partially-enlarged view of a portion P4 adjacent to the insulating ring 2, which is a second trench isolation including insulating materials and is configured to define a second area at the surface of the substrate, and FIG. 15C shows a partially-enlarged view of a portion Q4 adjacent to a first trench isolation of a device isolation section (STI) in a device area DA (a first area). The semiconductor chip 80 is substantially equal to the semiconductor chip 50 shown in FIG. 1, but as shown in FIG. 15B, the structure adjacent to the upper portion (the side of the first surface) of the insulating ring 2 differs from the structure shown in FIG. 1D. That is, the second insulating film 2b is not exposed to the first surface, but is covered with insulating films 31 and 32 for the STI 30. In addition, the insulating film 31 is mainly made of silicon nitride, and is referred to as a third insulating film. The silicon nitride has a high barrier, and can effectively suppress impurities from diffusing outwards. The insulating film 32 is mainly made of silicon oxide, and is referred to as a fourth insulating film. In addition, FIG. 15C shows a diffusion layer 33 of the semiconductor device element 5 and a contact 34, which is connected to the diffusion layer 33. Here, when the insulating film 32 is called as a first insulating film, the first insulating film 2a, the second insulating film 2b and the insulating film 31 are called as a second insulating film, a third insulating film and a fourth insulating film, respectively.

With reference to FIG. 16 to FIG. 19, a description will be given of a process of fabricating the semiconductor chip 80. In these figures, respective sub-figures A indicate schematic cross-sectional views, respective sub-figures B show partially-enlarged views of P4, and respective sub-figures C show partially-enlarged views of Q4.

Figure 16A:
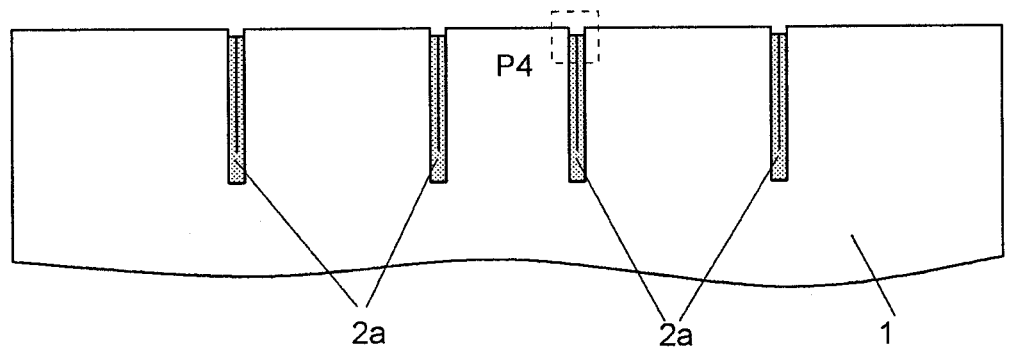
FIGS. 16A, 17A, 18A and 19A show process cross-sectional views depicting the process of fabricating a semiconductor chip 80 according to another embodiment of the invention.
Figure 16B:
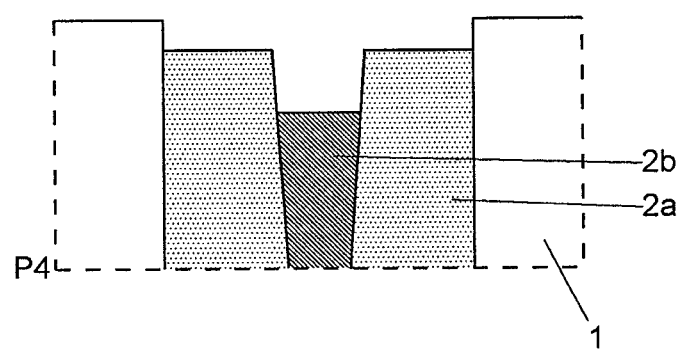
FIGS. 16B, 17B, 17C, 18B, 18C, 19B and 19C show respective partially-enlarged views thereof.

First, like the first exemplary embodiment, after the processes shown in FIG. 2 to FIG. 8 are executed, the second insulating film 2b is etched. For example, the second insulating film 2b (BPSG film) is wet-etched under conditions with high selectivity for the first insulating film 2a (TEOS-NSG film). In addition, dry etching may be used. Here, the first insulating film 2a is also slightly etched back (FIG. 16A and FIG. 16B).

Figure 17A:
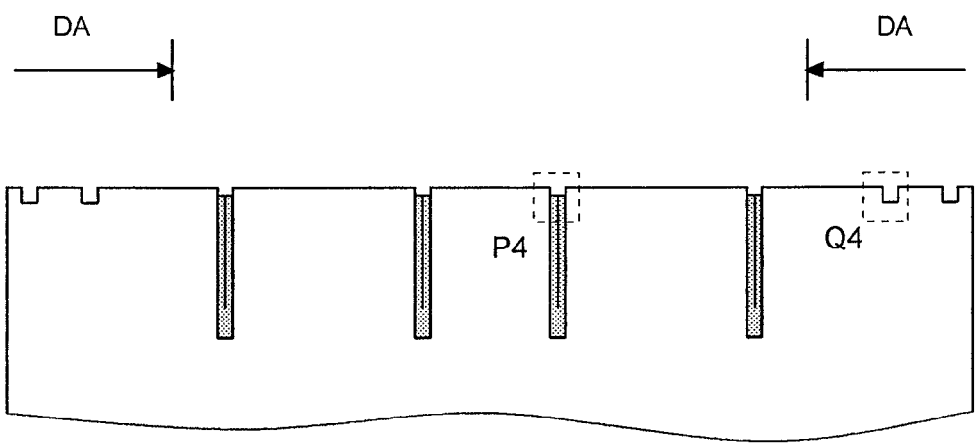
Figure 17B:
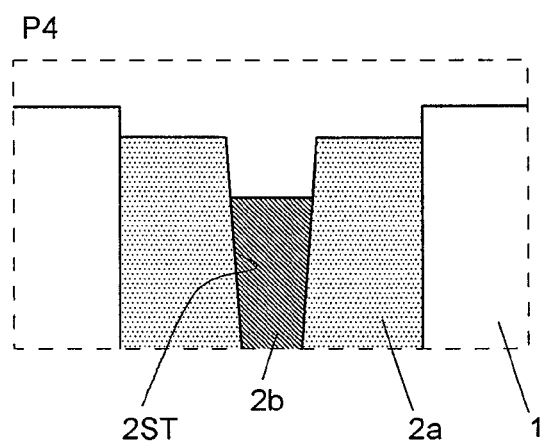
Figure 17C:
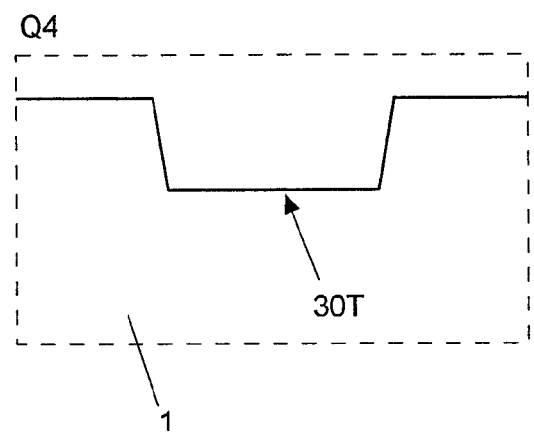

Afterwards, a trench 30T for an STI is formed in the device area DA by a conventional method. For example, a hard mask (e.g. a silicon nitride film, not shown) is formed in the entire surface, pattering is formed by a photolithography technology, and then a trench 30T for an STI is formed in the semiconductor substrate 1 by dry etching. The state of the trench 30T for the STI and the TSV trench portion after the hard mask is removed is shown in FIG. 17A to FIG. 17C.

Figure 18A:
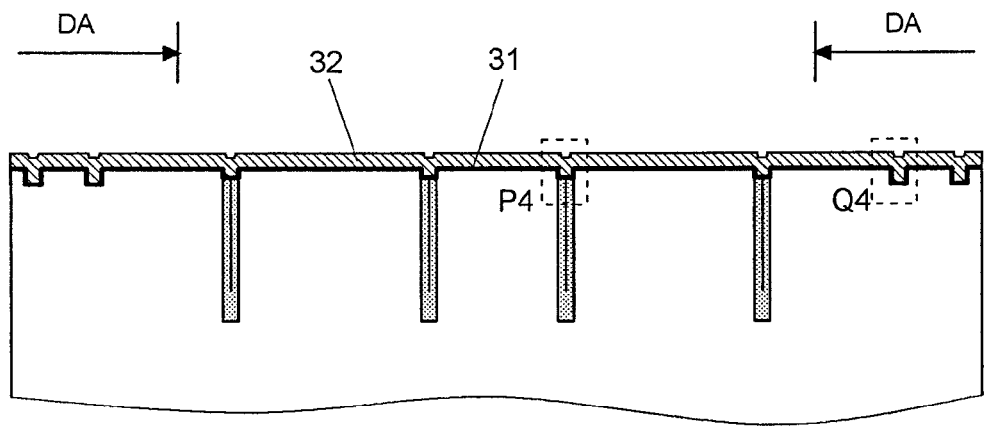
Figure 18B:
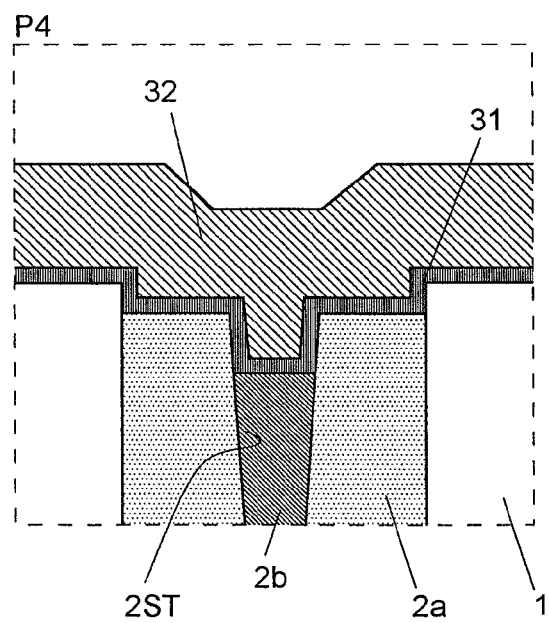
Figure 18C:
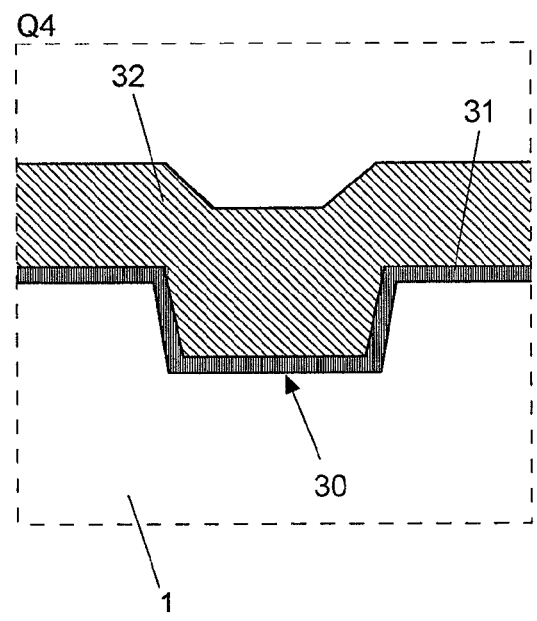

Afterwards, as shown in FIG. 18, an insulating film is buried in the trench 30T for the STI. As for the insulating film, the silicon nitride film 31 is formed by low-pressure CVD (LP-CVD) and then the silicon oxide film 32 is formed by high-density plasma CVD (HDP-CVD). Here, as shown in FIG. 18B, the silicon nitride film 31 and the silicon oxide film 32 are also formed in the TSV trench.

Figure 19A:
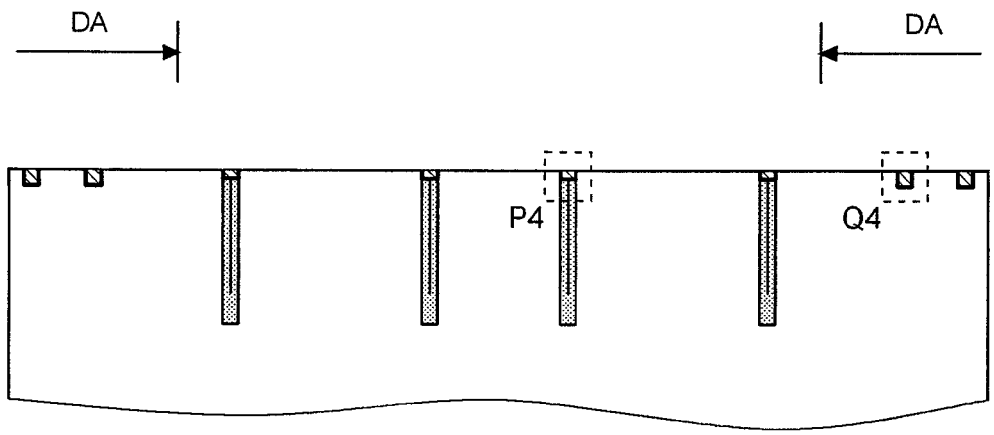
Figure 19B:
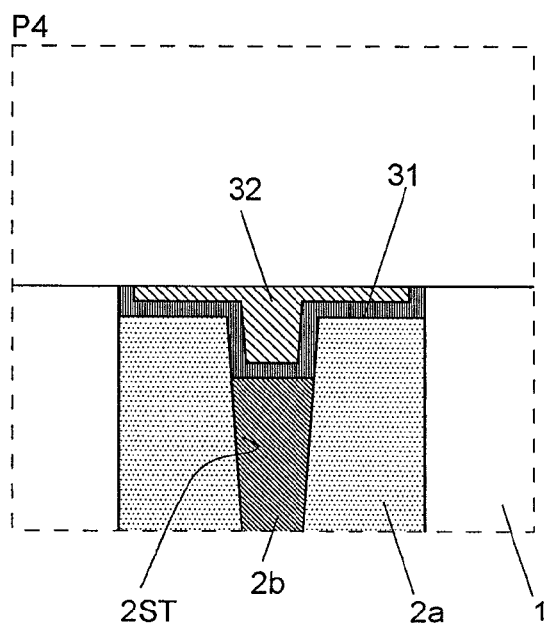
Figure 19C:
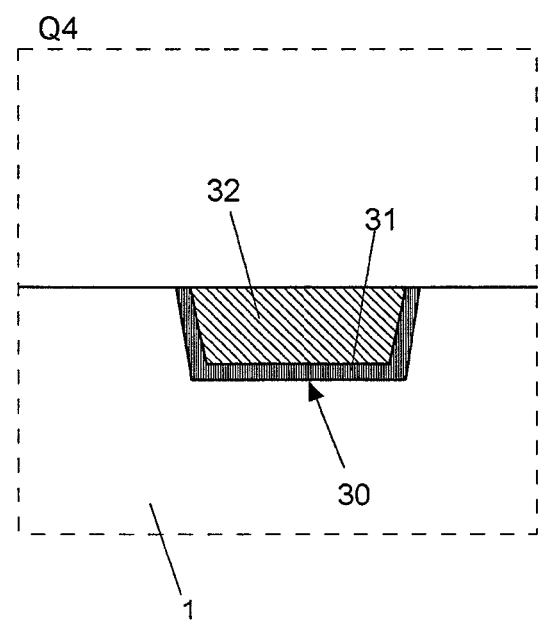

In sequence, a structure shown in FIG. 19 can be produced by performing planarization by CMP. In the TSV trench, the second insulating film 2b (BPSG film) is covered with the third insulating film 31 (silicon nitride film). Thus, it is possible to prevent impurities from diffusing from the second insulating film 2b outwards even through heat treatment (for example, heat treatment for the degassing and densification of the fourth insulating film (silicon oxide film 32) is performed.

Afterwards, the processes shown in FIG. 9 and FIG. 10 of the first exemplary embodiment are carried out, thereby producing the semiconductor chip 80, as shown in FIG. 15.

The second exemplary embodiment can also be performed by combining one or both of the modified examples 1 and 2.

What is claimed is:

1. A semiconductor device comprising:
a semiconductor substrate including a first surface and a second surface positioned opposite the first surface;
a device element formed on the first surface of the semiconductor substrate; and
an isolation portion penetrating the semiconductor substrate from the first surface to the second surface, the isolation portion comprising a first insulating film and a second insulating film, the first insulating film having a slit portion buried with the second insulating film,
wherein the first insulating film has a seam that is formed by growing the first insulating film from both sides of the isolation portion, and
the first insulating film divides in the slit portion on the seam at a side of the first surface.

2. The semiconductor device as claimed in claim 1, wherein the second insulating film contains at least one of boron and phosphorus.

3. The semiconductor device as claimed in claim 1, wherein the isolation portion further comprises a third insulating film, which buries the first and second insulating films in the semiconductor substrate under the first surface.

4. The semiconductor device as claimed in claim 3, wherein the third insulating film comprises a silicon nitride film; and
the first and second insulating films comprise a silicon oxide film.

5. The semiconductor device as claimed in claim 1, wherein the isolation portion has an annular structure, by which a first semiconductor area surrounded by the isolation portion is insulated and separated from a second semiconductor area outside thereof.

6. The semiconductor device as claimed in claim 5, further comprising an electrode penetrating the first semiconductor area from a side of the first surface to a side of the second surface.

7. A semiconductor wafer comprising:
a substrate;
a first trench isolation formed at a first surface of the substrate being configured to define a first area at the first surface, the first trench isolation including a first insulating film;
a device component formed on the first area; and
a second trench isolation formed at the first surface of the substrate being configured to define a second area at the first surface, a bottom of the second trench isolation being disposed in deeper position than a bottom of the first trench isolation from the first surface, the second trench isolation including a second insulating film and a third insulating film buried in a slit of the second insulating film, a bottom of the third insulating film being disposed in deeper position than the bottom of the first trench isolation and shallower than the bottom of the second trench isolation,
wherein the second insulating film comprises a seam that is formed by growing the second insulating film from both sides of the second trench isolation, and
the second insulating film divides in the slit on the seam at a side of the first surface of the substrate.

8. The semiconductor wafer as claimed in claim 7, wherein the bottom of the second trench isolation is disposed in a position that is closer to a second surface of the substrate than the first surface of the substrate, the second surface being positioned opposite the first surface.

9. The semiconductor wafer as claimed in claim 7, wherein the third insulating film contains at least one of boron and phosphorus.

10. The semiconductor wafer as claimed in claim 7, wherein the second trench isolation further comprises a fourth insulating film, which buries the second and third insulating films under the first surface of the substrate.

11. The semiconductor wafer as claimed in claim 10, wherein the fourth insulating film comprises a silicon nitride film; and
the first, second and third insulating films comprise a silicon oxide film.

12. The semiconductor wafer as claimed in claim 10, wherein the first trench isolation comprises the fourth insulating film; and
the fourth insulating film further buries the first insulating film under the first surface of the substrate.

13. A semiconductor device comprising:
a device-forming area, which is formed on a first surface of a semiconductor substrate;
an annular insulating-separation portion having a ring shape when viewed from above, the annular insulating-separation portion extending through a second surface of the semiconductor substrate opposite the first surface; and
an electrode extending through the semiconductor substrate, which is surrounded by the annular insulating-separation portion, from the first surface to the second surface, the electrode having terminals exposed to outsides of the first and second surfaces,
wherein the annular insulating-separation portion includes a first insulating film, which is buried from the first surface to the second surface, and a second insulating film, which is buried in a ring-shaped hole of the first insulating film, which is formed at a predetermined depth from a side of the first surface,
the second insulating film is buried in a position recessed from a plane defined by the first surface, and the semiconductor device further comprises a third insulating film disposed to isolate the second insulating film from the plane defined by the first surface, the third insulating film comprising silicon nitride as a main material.

14. The semiconductor device as claimed in claim 13, wherein the second insulating film comprises silicon oxide that contains at least one of boron and phosphorus as a main material.

15. The semiconductor device as claimed in claim 13, further comprising a device-isolation portion formed on the first surface of the substrate, wherein the device-isolation portion comprises an insulating film, the insulating film comprises a same composition to the third insulating film.

16. The semiconductor device as claimed in claim 15, wherein the annular insulating-separation portion further comprises a fourth insulating film disposed between a plane defined by the first surface and the third insulating film, the fourth insulating film comprising silicon oxide as a main material, wherein the device-isolation portion further comprises an insulating film, the insulating film comprises a same composition to the fourth insulating film.

17. The semiconductor device as claimed in claim 13, wherein the annular insulating-separation portion has a tapered shape, with a width thereof that is at the first surface being greater than a width thereof that is at a predetermined depth from the first surface.

* * * * *